(12) United States Patent
Kao

(10) Patent No.: US 6,184,086 B1
(45) Date of Patent: *Feb. 6, 2001

(54) METHOD FOR FORMING A FLOATING GATE SEMICONDUCTOR DEVICE HAVING A PORTION WITHIN A RECESS

(75) Inventor: David Y. Kao, Meridian, ID (US)

(73) Assignee: Micron Technology Inc., Boise, ID (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/218,860

(22) Filed: Dec. 22, 1998

Related U.S. Application Data

(62) Division of application No. 08/559,878, filed on Nov. 20, 1995, now Pat. No. 5,854,501.

(51) Int. Cl.[7] .................................................. H01L 21/336
(52) U.S. Cl. ........................ 438/259; 438/589; 438/593
(58) Field of Search ................................ 438/259, 264, 438/593, 594, 589, 257, 211

(56) References Cited

U.S. PATENT DOCUMENTS

| | | | |
|---|---|---|---|
| 4,169,291 | 9/1979 | Rossler | 365/185 |
| 4,222,062 | 9/1980 | Trotter et al. | 257/316 |
| 4,763,177 | 8/1988 | Paterson | 357/23.5 |
| 4,796,228 | 1/1989 | Baglee | 365/149 |
| 4,835,741 | 5/1989 | Baglee | 365/185 |
| 4,855,800 | 8/1989 | Esquivel et al. | 357/23.5 |
| 4,979,004 | 12/1990 | Esquivel et al. | 357/23.5 |
| 5,281,548 | 1/1994 | Prau | 257/315 |
| 5,380,672 | 1/1995 | Yuan et al. | 437/43 |
| 5,392,237 | 2/1995 | Iida | 257/316 |
| 5,429,970 | * 7/1995 | Hong | 438/264 |
| 5,472,893 | * 12/1995 | Iida | 438/259 |
| 5,501,996 | * 3/1996 | Yang et al. | 438/264 |

FOREIGN PATENT DOCUMENTS 6-104451 * 4/1994 (JP) ........................ 438/FOR 203

OTHER PUBLICATIONS

F.E. Holmes et al., "VMOS—A New MOS Integrated Circuit Technology", 1974, Solid–State Electronics, pp. 791–797.

C.A.T. Salama, "A New Short Channel MOSFET Structure (UMOST)", 1977, Solid State Electronics, pp. 1003–1009.

* cited by examiner

Primary Examiner—Michael Trinh

(57) ABSTRACT

A memory device, and a method for manufacturing same, comprises a semiconductor layer having a first surface and a second surface, and further having a trench therein. The memory device further comprises a transistor source within the first surface of the semiconductor layer, the source having a lower surface, wherein a bottom of the trench extends below the lower surface of the source. A transistor drain within the second surface of the semiconductor layer comprises a lower surface with the trench bottom extending below the lower surface of the drain and wherein the trench separates the source and drain. The memory device further comprises a transistor channel along at least the bottom of the trench, a floating gate at least partially within the trench, and a control gate overlying the floating gate.

10 Claims, 5 Drawing Sheets

US 6,184,086 B1

METHOD FOR FORMING A FLOATING GATE SEMICONDUCTOR DEVICE HAVING A PORTION WITHIN A RECESS

This is a division of U.S. application Ser. No. 08/559,878 filed Nov. 20, 1995 and issued Dec. 29, 1998 as U.S. Pat. No. 5,854,501.

FIELD OF THE INVENTION

The invention relates to the field of semiconductor manufacture, and more specifically to a floating gate memory device and a method for forming a floating gate memory device.

BACKGROUND OF THE INVENTION

A floating gate memory device such as an erasable programmable read-only memory (EPROM) includes an array of programmable and erasable memory cells. Typically, each memory cell comprises a single n-channel metal oxide semiconductor (NMOS) transistor, including a floating gate between a control gate and a channel. A bit of information is stored in each memory cell by storing a charge on the floating gate, to adjust a Vt (threshold voltage) of the transistor, which is the voltage that must be overcome by the gate to source voltage (Vgs) to activate the device.

For example, Vt for a typical transistor with no charge stored on its floating gate is approximately one to two volts. A voltage of at least one to two volts must be applied between the control gate and the source junction for the device to activate, that is, to allow current to flow through the device. If a charge is present on the floating gate Vt is effectively raised by the charge present. The net effect of this is that an intermediate voltage (a sense voltage) can be applied between the source and the control gate and if the transistor activates it is not programmed and if the transistor does not activate it is programmed.

The memory cells in the array are accessed via a plurality of column lines (digit lines) and a plurality of row lines (word lines). Each of the column lines is coupled to the drain of a corresponding memory cell transistor, and each of the row lines is coupled to a control gate of a corresponding memory cell transistor. The respective column and row lines are driven by address decoder and timing circuitry.

Several capacitances exist in an EPROM cell. The equation CC=C1/(C1+C2+C3+C4) describes these capacitances, where CC is the coupling coefficient, C1 is the coupling between the floating gate and the control gate, C2 is the coupling between the floating gate and the source, C3 is the coupling between the floating gate and the drain, and C4 is the coupling between the floating gate and the channel. As an example, if C1=0.5, C2=0.1, C3=0.1, and C4=0.3, the coupling coefficient would equal 0.5 (50%). If the area of the surface of the floating gate proximal to the control gate is increased by 100%, C1 would increase to 1.0, and CC would increase to 0.67. With this increase, the size of the control gate and the floating gate could decrease by 50%, which would reduce the coupling coefficient by 17% back to the original 50%. As can be determined from the equation, the coupling coefficient can not reach the ideal state (1.00) since the capacitance between the floating gate and the control gate is always divided by itself plus some additional capacitance. Still, the goal of designers is to bring the coupling coefficient as close to unity as possible.

One problem associated with EPROMs is that two adjacent cells which share the same column line can interfere with each other electrically. For example, a cell can be slightly or "softly" erased or programmed when an adjacent cell has erasing or programming voltages applied to it because the two cells share their source and drain.

An EPROM cell which has an improved coupling coefficient, increased resistance to drain disturb between adjacent cells, and more efficient programming would be desirable.

SUMMARY OF THE INVENTION

A semiconductor device comprises a semiconductor layer having a trench therein, the trench having a bottom. The device further comprises a transistor source and a transistor drain separated by the trench, the source and the drain each having a lower surface. The trench bottom is below the lower surface of at least one of the source and the drain. A transistor channel runs along the bottom of the trench, and a floating gate is at least partially within the trench.

A method for forming a memory device comprises the steps of forming a transistor source having a lower surface and a transistor drain having a lower surface, the source and drain formed in a semiconductor substrate. A trench having a bottom is formed in the semiconductor substrate, the trench separating the source and drain. The trench is formed such that the bottom of the trench is below the lower surface of at least one of the source and the drain. Next, a floating gate is formed at least partially within the trench.

Various objects and advantages will become apparent to those skilled in the art from the following detailed description read in conjunction with the appended claims and the drawings attached hereto.

The drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
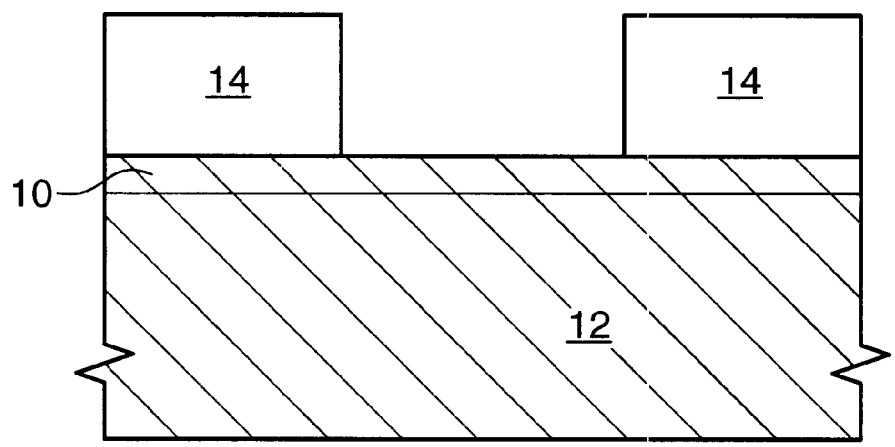
FIGS. 1–3 are cross sections showing one inventive method for forming one inventive embodiment of the invention.
Figure 2:
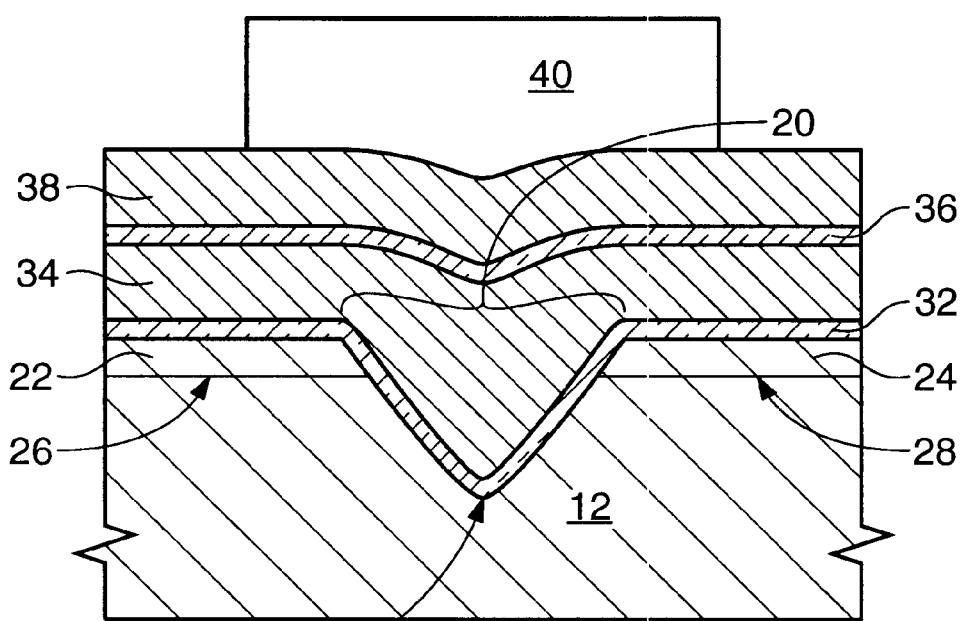
Figure 3:
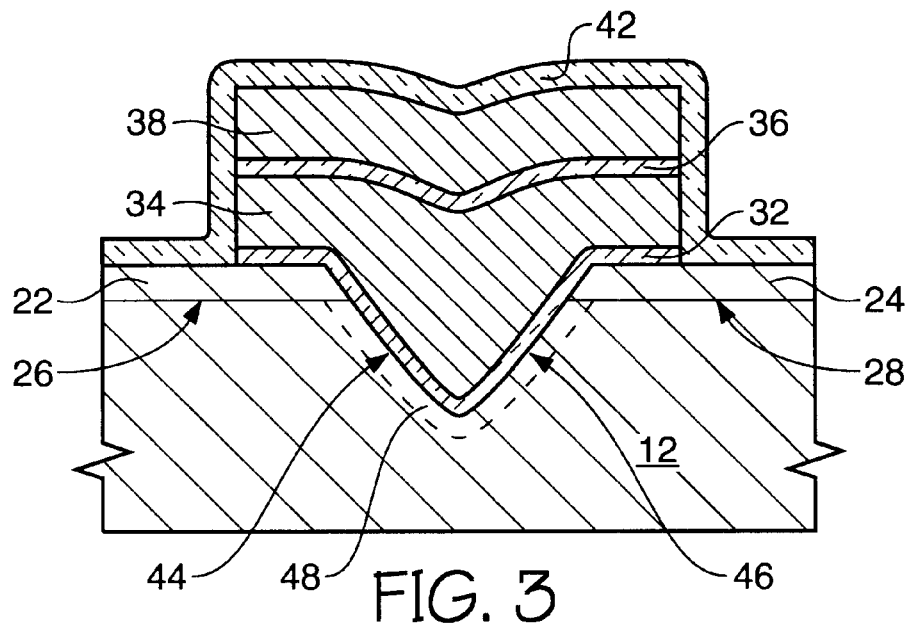

FIGS. 1–3 are cross sections showing one embodiment of an inventive method for forming an inventive memory cell. In FIG. 1, a diffusion area 10, such as an N-type area, is formed in a semiconductor substrate 12. The diffusion area can be formed by doping or other means known in the art for forming source/drain areas in a substrate. A mask layer 14, such as a photoresist layer is formed over the substrate and a portion of the substrate is left exposed.

Next, the exposed substrate is removed using a wet or dry etch to result in a trench 20 in the substrate 12 as shown in FIG. 2. The trench of FIG. 2 is formed with an etch having a high isotropic characteristic to result in a trench having a "V" shape as shown. In this embodiment, etching the trench removes a portion of the diffusion area, and the trench divides the diffusion area into two portions which will form a transistor source 22 and a transistor drain 24, which self-aligns the source and drain areas to the trench. The trench can have a depth of between about 3,000 angstroms (Å) and about 7,000 Å, although other depths may be workable.

The source and drain both have a lower surface (26, 28 respectively) and the substrate is etched until a bottom 30 of the trench 20 is below the lower surface of at least one of the source and drain. The trench is between the source and drain and thereby separates the source and drain.

Subsequently, a first insulation layer 32 such as a tunnel oxide layer is formed over at least the trench, and a floating gate layer 34 such as a blanket layer of doped or undoped polycrystalline silicon is formed over the insulation layer at least partially within the trench 20. A tunnel oxide layer having a thickness of between about 30 Å and about 200 Å, and a floating gate layer having a thickness of between about 500 Å and about 1,500 Å would function sufficiently, although other thicknesses may function adequately for each layer. A second insulation layer 36 is formed over the floating gate layer and a control gate layer 38, such as doped or undoped polycrystalline silicon between about 1,500 Å and about 3,000 Å, is formed over the second insulation layer. A mask layer 40 such as photoresist is formed over the trench area to define the floating gate and control gate.

An etch such as a vertical (anisotropic) etch is performed on the FIG. 2 structure to result in the structure of FIG. 3. Wafer processing continues, for example to form an insulation layer 42 such as a spacer layer, and to form digit lines and other features (not shown) known in the art to produce a floating gate device.

In FIG. 3, it can be seen that the trench comprises first 44 and second 46 sides. The first side 44 comprises a portion of the source 22, and the second side 46 comprises a portion of the drain 24. The channel region 48 is between the source and drain along the sides and bottom of the trench, such that the first side comprises a portion of the source and the channel, and the second side comprises the drain and a portion of the channel. This effectively increases the length of the channel thereby increasing the cell's resistance to drain disturb from an adjacent cell.

In the embodiments where the trench is self-aligned to the source and drain areas, the floating gate can overlie at least three sides of the source and at least three sides of the drain as shown in FIG. 3. The three sides include the top side, the lower side (the lower surface), and the side nearest the trench.

Figure 4:
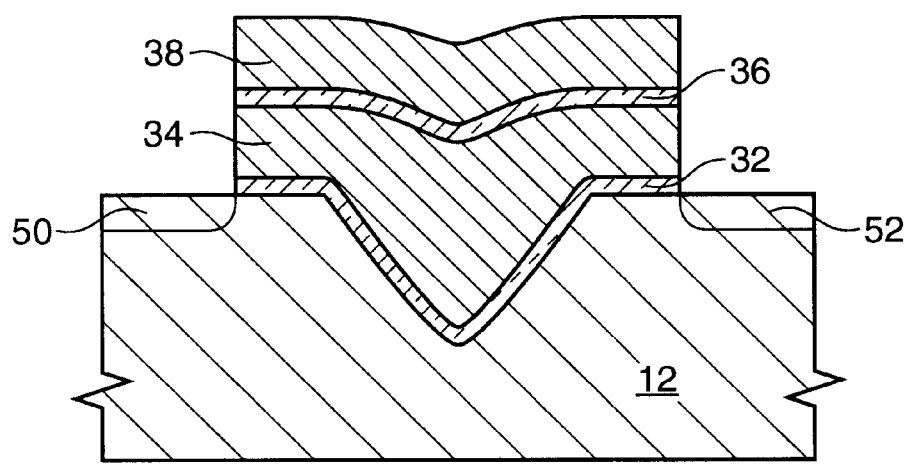
FIG. 4 is a cross section showing another embodiment of the inventive memory cell.

FIG. 4 shows another embodiment of the invention. In this embodiment, the diffusion areas (the source 50 and drain 52) are self aligned to the floating gate 34, rather than the embodiment of FIGS. 1–3 where the diffusion areas 22, 24 are self aligned to the trench 20. In the FIG. 4 embodiment, the etch to form the floating gate 34 is performed before the doping step to form the diffusion areas. After etching the floating gate layer, the substrate doping is performed which reduces the implantation of ions into the substrate under the floating gate. In either case, the floating gate can be electrically coupled with the source and drain.

Figure 5:
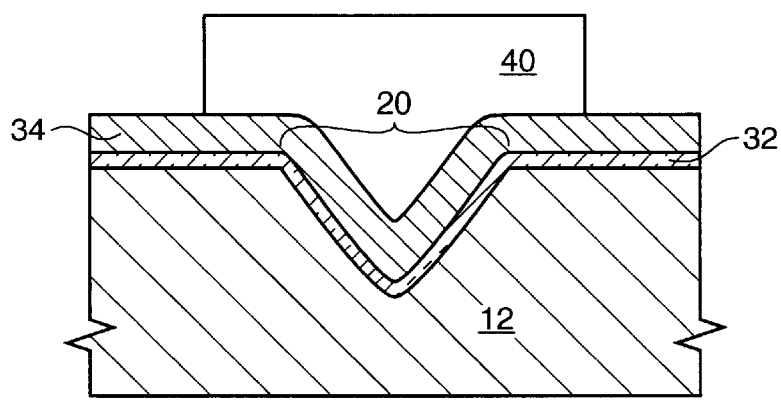
FIGS. 5–7 are cross sections showing another inventive method for forming an inventive embodiment of the invention.
Figure 6:
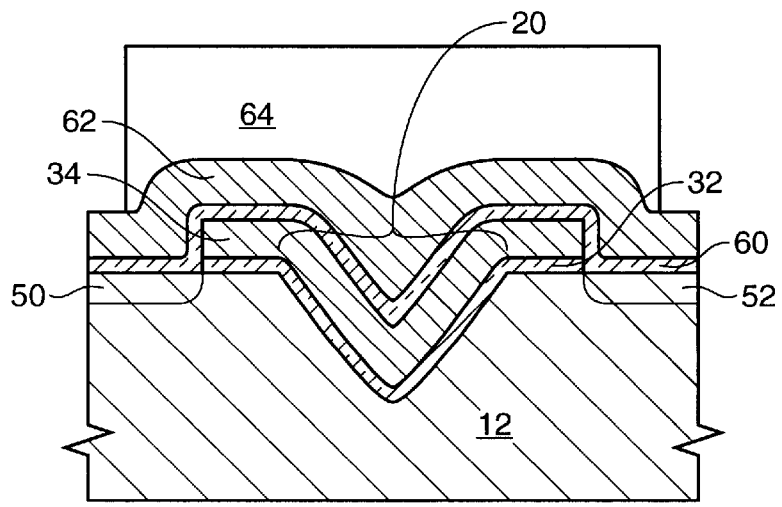
Figure 7:
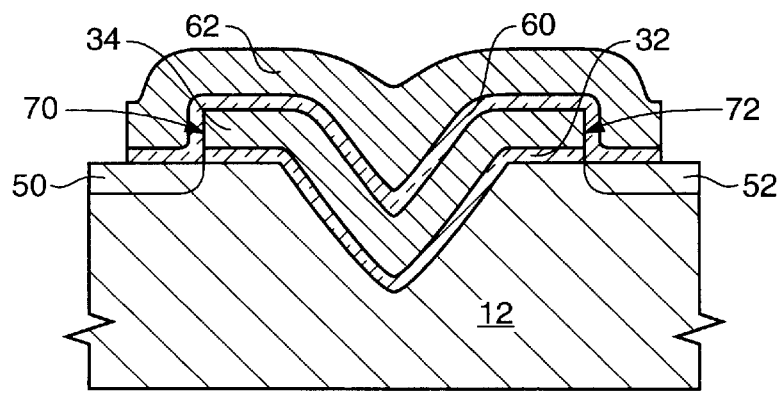

FIGS. 5–7 show another inventive embodiment to form a floating gate device. In this embodiment the substrate 12 is etched to form a trench 20, an insulation layer 32 such as a tunnel oxide layer then a floating gate layer 34 are formed, and a mask 40 is formed over the floating gate layer 34. The insulation layer and the floating gate layer are etched and an implant self-aligns the source 50 and drain 52 to the floating gate. Alternately, the doping can performed before the trench etch to align the source and drain with the trench.

Subsequently, an insulation layer 60 such as a layer of nitride and a layer of oxide, or an oxide-nitride-oxide layer, is formed over the floating gate 34. An oxide layer between about 50 Å and about 100 Å, and a nitride layer between about 100 Å and about 250 Å would function sufficiently. A control gate layer 62 is formed over the insulation 60 and a patterned mask 64 defines the control gate. An etch, such as an anisotropic etch, etches the control gate layer 62 to form the control gate 62 over the floating gate as shown in FIG. 7.

As shown in FIG. 7, which is a cross section perpendicular with the control gate 62 across the source 50 and drain 52, the control gate extends beyond first 70 and second 72 edges of the floating gate 34. This may provide the advantage of increasing the coupling between the control gate and the floating gate, which improves Fowler-Nordheim (F-N) tunneling during programming of the device if F-N tunneling is used rather than electron injection from the channel.

FIG. 7 also shows an embodiment wherein the thickness of the floating gate layer and the width of the trench are such that a portion of the control gate 62 is in the trench 20. The ratio of the trench width and floating gate layer thickness can be determined by one of skill in the art.

Figure 8:
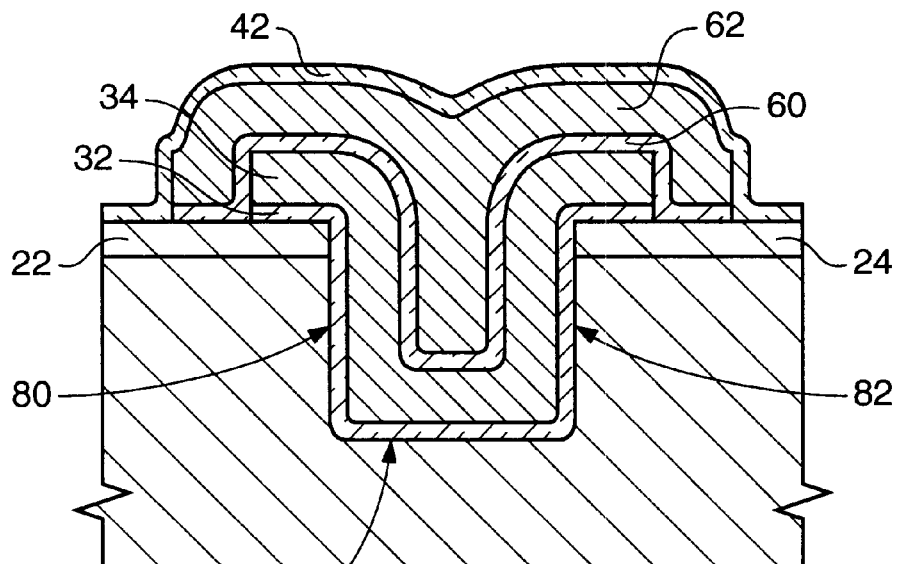
FIGS. 8–9 are cross sections showing other embodiments of the inventive cell.
Figure 9:
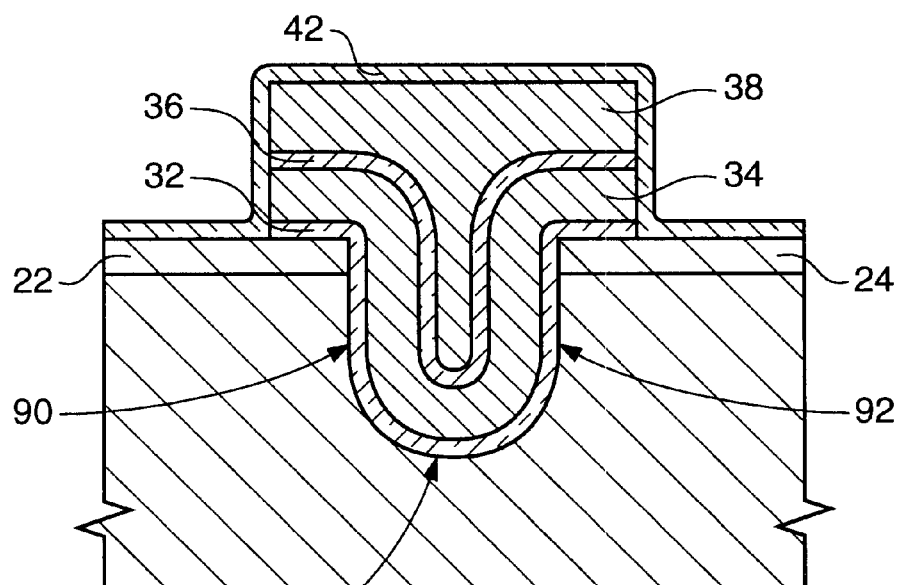

The formation of the control gate within the trench is further shown in FIGS. 8 and 9. In FIG. 8, an anisotropic (vertical) etch is performed to etch a trench having vertical or near vertical first 80 and second 82 sides and a horizontal bottom 84. In the FIG. 9 embodiment, an anisotropic etch was performed to form vertical or near vertical first 90 and second 92 sidewalls, then the etch was altered to have a more isotropic characteristic to form the U shape having the rounded bottom 94 as shown.

Figure 10:
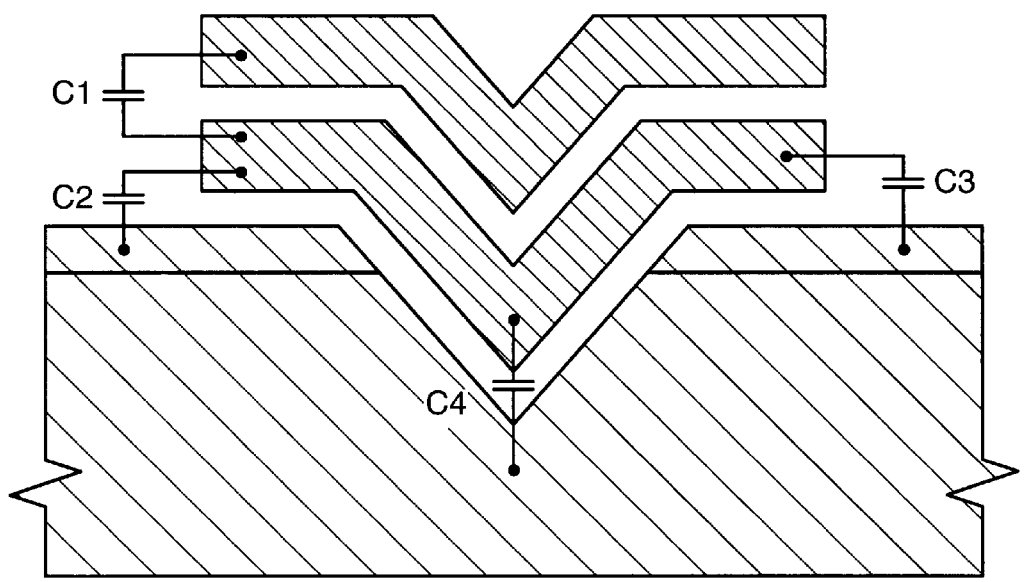
FIG. 10 shows a representation of various capacitances within an inventive cell.

An inventive floating gate device formed in accordance with the inventive method effectively lengthens the channel over a conventional device and decreases the coupling between the floating gate and the channel. The surface area of the floating gate, the control gate, and the channel all increase from being angled in the trench. As a result C1 and C4 in the equation $CC=C1/(C1+C2+C3+C4)$, described in the background section above and in FIG. 10, increase. If C1 and C4 increase by "k" times, where k>1, the resulting CC' can be described by the equation $kC1/(kC1+C2+C3+kC4)$, or $C1/(C1+C2/k+C3/k+C4)$. Therefore, CC'>CC which results in an improved coupling coefficient. Having a longer channel also reduces the drain disturbance from an adjacent cell.

The inventive design also comprises a sharp corner, for example shown on FIG. 9 as element 90, which has a high E-field and improves programming of the cell by allowing electrons to inject to the floating gate. A conventional cell is typically programmed by applying about 9.0 volts between the source and the control gate and allowing the drain to float. The inventive cell may require less programming voltage, for example by applying between about 3.0V to about 5.0V between the control gate and the source and allowing the drain to float or grounding the drain. Additionally, the erase of the inventive cell may be faster.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method for forming a memory device comprising the following steps:
   forming a transistor source having a lower surface and a transistor drain having a lower surface, said source and drain formed in a semiconductor substrate;
   forming a trench in said semiconductor substrate having, in cross-section, a "V" shape and a bottom, said trench separating said source and said drain wherein said bottom of said trench is below said lower surface of at least one of said source and said drain;
   providing a first insulation layer over said semiconductor substrate within said trench;
   forming a floating gate layer at least partially within said trench wherein said first insulation layer separates said floating gate layer from said semiconductor substrate;
   forming a second insulation layer over said floating gate layer;
   forming a control gate layer over said floating gate layer and separated from said floating gate layer by said second insulation layer;
   forming a patterned mask over said control gate layer, said second insulation layer, said floating gate layer and said first insulation layer; and
   etching said control gate layer, said second insulation layer, said floating gate layer, and said first insulation layer using said mask as a pattern,
   wherein said step of forming said source and said drain comprises the step of forming said source and drain subsequent to said step of etching said floating gate layer such that said both of said source and drain are self aligned to said floating gate layer.

2. The method of claim 1 wherein at least a portion of said control gate is in said trench.

3. The method of claim 1 wherein said trench comprises first and second sides and said first and second sides of said trench each comprise a portion of said channel.

4. The method of claim 1 wherein said trench has a depth of between about 3,000 Å and about 7,000 Å further comprising the following steps:
   during said step of providing said first insulation layer, forming a tunnel oxide having a thickness of between about 30 Å and about 200 Å between said substrate and said floating gate;
   during said step of forming said floating gate layer, forming said floating gate layer having a thickness of between about 500 Å and about 1,500 Å;
   during said step of forming said control gate layer, forming said control gate layer having a thickness of between about 1,500 Å and about 3,000 Å superjacent said floating gate; and
   during said step of forming said second insulation layer, forming an oxide layer having a thickness of between about 50 Å and about 100 Å and forming a nitride layer having a thickness of between about 100 Å and about 250 Å.

5. The method of claim 1 further comprising the step of forming said bottom of said trench at a level lower than said lower surface of said source and said lower surface of said drain.

6. A method used during the formation of a semiconductor device comprising the following steps:
   providing a semiconductor layer having a trench therein, said trench having a bottom, first and second sides, and in cross section comprises a "V" shape;
   forming an oxide layer having a generally uniform thickness over said bottom and said first and second sides;
   forming a transistor source and a transistor drain separated by said trench, said source and said drain each having a lower surface, said trench bottom being below said lower surface of at least one of said source and said drain;
   providing a transistor channel along said bottom of said trench; and
   forming a floating gate layer at least partially within said trench;
   forming an insulation layer overlying said floating gate layer;
   forming a control gate layer overlying said insulation layer;
   providing a patterned mask overlying said control gate layer; and
   etching said control gate layer, said insulation layer, said floating gate layer, and said oxide layer using said mask as a pattern,
   wherein said step of forming said transistor source and drain comprises the step of forming both of said source and drain subsequent to said step of etching said floating gate layer such that both of said source and drain are self aligned to said floating gate layer.

7. The method of claim 6 wherein said bottom of said trench is below said lower surface of said source and below said lower surface of said drain.

8. A method for forming a memory device comprising the following steps:
   providing a semiconductor layer having a first surface and a second surface and further having a trench therein, said trench having a bottom and first and second sides and a depth of between about 3,000 Å and about 7,000 Å;
   providing a first oxide layer consisting essentially of tunnel oxide having a generally uniform thickness of between about 30 Å and about 200 Å over said bottom and said first and second sides of said trench;
   forming a transistor source within said first surface of said semiconductor layer, said source having a lower surface, wherein a bottom of said trench extends below said lower surface of said source;
   forming a transistor drain within said second surface of said semiconductor layer, said drain having a lower surface, wherein said bottom of said trench extends below said lower surface of said drain, and wherein said trench separates said source and said drain;
   forming a transistor channel along at least said bottom of said trench;
   forming a floating gate layer having a thickness of between about 500 Å and about 1,500 Å formed at least partially within said trench;
   forming a second oxide layer having a thickness of between about 50 Å and about 100 Å over said floating gate layer;
   providing a nitride layer having a thickness of between about 100 Å and about 250 Å over said second oxide layer; and
   forming a control gate layer having a thickness of between about 1,500 Å and about 3,000 Å over said second oxide layer and superjacent and overlying said floating gate layer;

forming a patterned mask layer over said control gate layer; and etching said control gate layer, said nitride layer, said second oxide layer, said floating gate layer, and said tunnel oxide layer using said mask as a pattern, wherein said steps of forming said transistor source and drain comprise the step of forming both of said source and drain subsequent to said step of etching said floating gate layer such that both of said source and drain are self aligned to said floating gate layer.

9. A method used during the formation of a semiconductor device comprising the following steps:

providing a semiconductor substrate assembly comprising a semiconductor wafer;

forming a trench in said semiconductor wafer having, in cross-section, first and second sidewalls and a bottom;

providing a first insulation layer within said trench;

forming a floating gate layer at least partially within said trench wherein said first insulation layer separates said floating gate layer from said wafer;

forming a second insulation layer over said floating gate layer;

forming a control gate layer over said floating gate layer and separated from said floating gate layer by said second insulation layer;

etching said control gate layer to form a control gate, said second insulation layer, said floating gate layer to form a floating gate, and said first insulation layer; and subsequent to said step of etching said floating gate layer, doping said wafer to form both a transistor source and a transistor drain both are self aligned to said floating gate.

10. The method of claim 9 wherein said step of doping said wafer forms said source and drain separated by said trench.

* * * * *